(12) United States Patent
Brandenburg et al.

(10) Patent No.: US 6,833,628 B2
(45) Date of Patent: Dec. 21, 2004

(54) MUTLI-CHIP MODULE

(75) Inventors: Scott D. Brandenburg, Kokomo, IN (US); Darrel E. Peugh, Kokomo, IN (US); Matthew R. Walsh, Sharpsville, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/321,900

(22) Filed: Dec. 17, 2002

(65) Prior Publication Data

US 2004/0113281 A1 Jun. 17, 2004

(51) Int. Cl.[7] .............................................. H01L 23/48
(52) U.S. Cl. ........................ 257/778; 257/778; 257/723
(58) Field of Search ................................. 257/778, 787, 257/723, 724, 686, 737; 361/764, 760

(56) References Cited

U.S. PATENT DOCUMENTS

| | | | |
|---|---|---|---|
| 5,448,825 A | 9/1995 | Lee et al. ...................... 29/827 |
| 5,570,274 A | 10/1996 | Saito et al. ................... 361/784 |
| 5,615,089 A | * 3/1997 | Yoneda et al. ............... 361/764 |
| 5,770,477 A | 6/1998 | Brandenburg | |
| 5,914,535 A | 6/1999 | Brandenburg | |
| 5,981,312 A | 11/1999 | Farquhar et al. ............ 483/112 |
| 6,118,184 A | * 9/2000 | Ishio et al. ................... 257/787 |
| 6,285,559 B1 | * 9/2001 | Fukiharu ....................... 361/760 |
| 6,383,846 B1 | * 5/2002 | Shen et al. ................... 438/127 |
| 2001/0013640 A1 | 8/2001 | Tao .............................. 257/667 |

FOREIGN PATENT DOCUMENTS

EP          1 096 567 A2     5/2001

OTHER PUBLICATIONS

European Search Report Mar. 3, 2004.

* cited by examiner

*Primary Examiner*—David Nelms
*Assistant Examiner*—Thinh T Nguyen
(74) *Attorney, Agent, or Firm*—Stefan V. Chmielewski

(57) ABSTRACT

A package and packaging method that incorporates multiple surface-mounted devices mounted to the package, which in turn can be mounted onto a circuit board. The package generally includes a pair of laminate substrates that together form a chip carrier and input/output (I/O) interface structure for the devices. The devices are mounted to opposite surface of a first of the substrates. The second substrate is attached to the first substrate, and has an interior opening therethrough. The first and second substrates are attached to each other such that devices mounted on one surface of the first substrate are disposed within the interior opening of the second laminate substrate. A mold compound can be applied to underfill and encapsulate the devices mounted to the surfaces of the first substrate.

15 Claims, 3 Drawing Sheets

MUTLI-CHIP MODULE

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to circuit device packages. More particularly, this invention relates to a multi-chip module (MCM) and method adapted to permit both underfilling and overmolding of surface-mounted devices on opposite surfaces of a laminate substrate within the MCM.

(2) Description of the Related Art

A flip chip is generally a surface-mounted (SM) device in the form of a monolithic semiconductor chip, such as an integrated circuit (IC) chip, having bead-like solder terminals formed on one of its surfaces. The terminals, also referred to as solder bumps, serve to both secure the chip to a circuit board and electrically interconnect the flip chip circuitry to a conductor pattern formed on the circuit board, which may be a ceramic substrate, printed circuit board (PCB), printed wiring board (PWB), flexible circuit, or a silicon substrate.

While typically mounted directly to a substrate, flip chips have been incorporated into packages, an example of which is ball grid array (BGA) packages. An example of a BGA package 110 is shown in FIG. 1 as including an IC semiconductor chip 112 that is wire bonded to a substrate 114, e.g., a laminate PCB, with wires 116. The wires 116 are electrically connected through vias (not shown) in the substrate 114 to terminals 118 on the opposite surface of the substrate 114. Similar to the flip-chip process, the terminals 118 serve as interconnects between the chip 112 and a conductor pattern on a circuit board (not shown) to which the BGA package 110 will be mounted. FIG. 2 is an example of the use of a flip chip 122 in a BGA package 120 to form a single-chip module. The flip chip 122 is equipped with solder bumps that form solder joint connections 126 when the chip 122 is flip-chip mounted to a conductor pattern on a substrate 124, e.g., a high-density PCB, which can then be mounted to a circuit (mother) board (not shown) with terminals 128 on the lower surface of the substrate 124. In the case where the substrate 124 is a PCB, it is desirable to underfill the flip chip 122 with a filled epoxy 130 to ensure the reliability of the solder joint connections 126. Finally, FIG. 2 shows the interior of the BGA package 120 comprising a molding compound 132 that overmolds the chip 122.

While the packaging technique of FIG. 2 capitalizes on the processing and assembly advantages provided by flip chips and BGA's, further improvements in packaging processes and density are continuously sought. For example, the underfilling process is both cumbersome and expensive, and becomes more difficult as the number of flip-chips mounted to a substrate increases, especially if the chips are to be mounted to both surfaces of the substrate.

BRIEF SUMMARY OF THE INVENTION

The present invention provides a package and packaging method that incorporate multiple surface-mounted devices, such as flip chips, mounted to a chip carrier, which in turn can be mounted onto a circuit board. The package is configured to provide a cost-effective, high-density multi-chip module that is also configured to facilitate underfilling and/or overmolding of circuit devices mounted on both sides of the chip carrier.

The package of this invention generally includes a pair of laminate substrates that together form a chip carrier and input/output (I/O) interface structure for a number of chips, e.g., flip chips, wire-bonded chips and/or other surface-mount components. A first of the laminate substrates has a first conductor pattern on a first surface thereof and a second conductor pattern on an oppositely-disposed second surface thereof. The second laminate substrate is attached to the first laminate substrate, and has an interior opening therethrough that is surrounded by a frame portion. The frame portion has a first surface facing the first laminate substrate and an oppositely-disposed second surface on which solder terminals are present. One or more surface-mounted devices are mounted to each of the first and second surfaces of the first laminate substrate. The first and second laminate substrates are attached to each other such that the surface-mounted device mounted to the second surface of the first laminate substrate is disposed within the interior opening of the second laminate substrate.

In view of the above, the present invention provides a process for forming an MCM package in which one or more surface-mounted devices are located within a cavity defined by the interior opening in the second laminate substrate. The second laminate substrate is preferably configured with lateral openings, preferably located in its first surface and therefore between the first and second laminate substrates. Through one of these lateral openings, a molding compound can be injected into the cavity defined by the interior opening in the second laminate substrate, with the result that the device mounted to the second surface of the first laminate substrate can be simultaneously underfilled and overmolded. As such, the present invention provides a dual-sided MCM package that can be equipped with flip chips on opposite surfaces of a laminate substrate. Advantages include a relatively lowcost, electrically testable package whose surface-mounted devices can readily be both underfilled and overmolded to promote the reliability of the package.

Other objects and advantages of this invention will be better appreciated from the following detailed description.

DETAILED DESCRIPTION OF THE INVENTION

Figure 1:
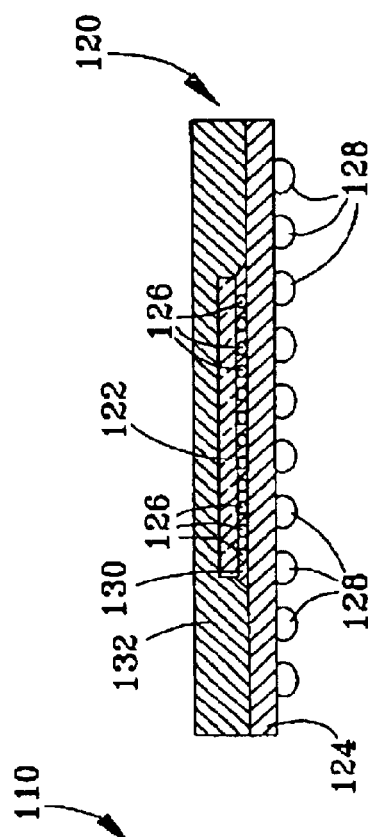
FIGS. 1 and 2 represent cross-sectional views of BGA packages in accordance with the prior art.
Figure 2:
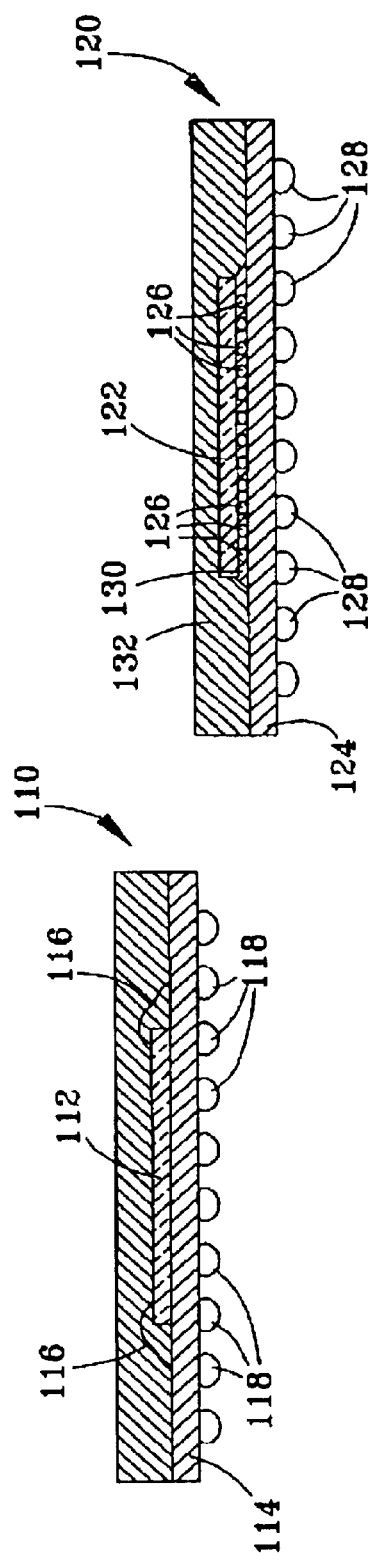
Figure 3:
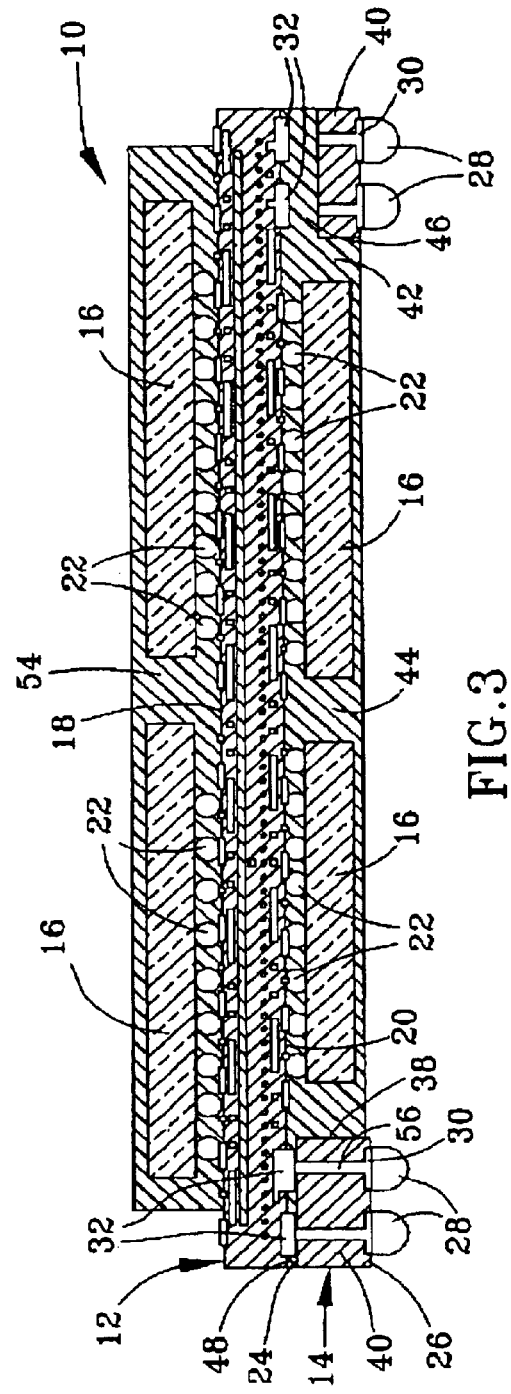
FIG. 3 represents a cross-sectional view of a multi-chip BGA package that makes use of a pair of substrates attached together to form a chip carrier and input/output interface structure in accordance with the present invention.

A flip-chip package 10 in accordance with this invention is represented in cross-section in FIG. 3. As shown, the package 10 includes a pair of laminate PCB's 12 and 14 that are secured together to form a unitary chip carrier and input/output (I/O) interface structure for a number of flip chips 16 mounted to both surfaces of one of the PCB's 12. As such, the package 10 can be termed a dual-sided flip-chip MCM BGA package. While flip chips 16 are illustrated in the Figures, various types of circuit components could be present in the package 10 in addition to or in place of the flip chips 16, for example, wire-bonded chips and/or other surface-mount components.

The upper PCB 12 (as viewed in FIG. 3) is shown as a multi-layer laminate substrate, though other types of substrates could foreseeably be used. The flip chips 16 are mounted to opposite surfaces 18 and 20 of the PCB 12, as can be other surface-mounted (SM) components, such that the PCB 12 will be referred to as the carrier PCB 12. In accordance with flip chip mounting techniques, the chips 16 are physically and electrically connected to conductor patterns on the chip carrier PCB 12 with solder joint connections 22 formed by reflowing solder bumps on the chips 16.

The second PCB 14 is depicted as a two-layer laminate substrate, though again other substrate configurations are within the scope of this invention. One surface 24 of the PCB 14 faces the carrier PCB 12, while the opposite surface 26 is equipped with solder balls 28 attached to bond pads 30, through which I/O signals from the chips 16 can be communicated with a mother board (not shown) to which the package 10 is eventually mounted. As such, the PCB 14 will be referred to as the I/O PCB 14. The I/O PCB 14 can be attached to the carrier PCB 12 by a suitable method that allows electrical interconnection between the two PCB's 12 and 14. The PCB's 12 and 14 may be attached at the manufacturing level, or in a subsequent operation with a conductive adhesive or, as represented in FIG. 3, solder 32. Whatever the attachment method, electrical paths must be provided between the flip chip connections 22 and the solder balls 28, such as through metallized vias 56 through the I/O PCB 14.

Figure 4:
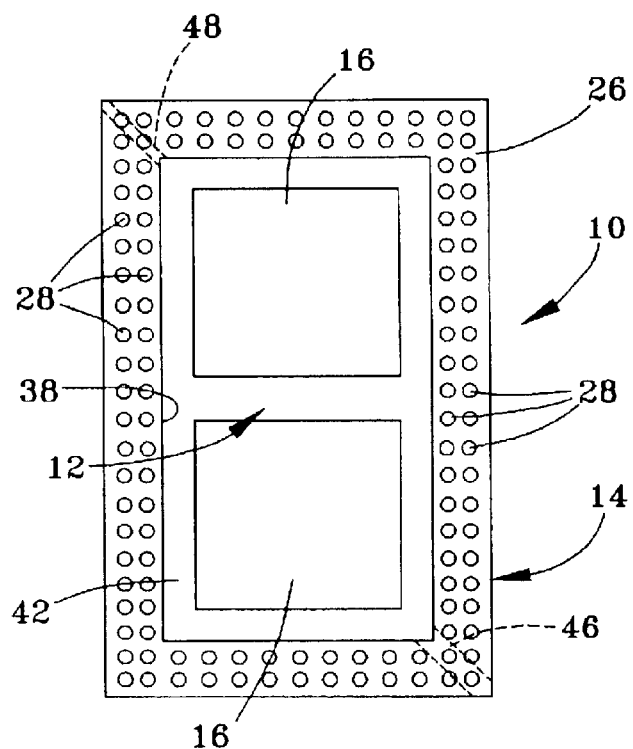
FIG. 4 is a bottom view of the package of FIG. 3, in which a mold compound is omitted to reveal flip chips mounted within the package.
Figure 5:
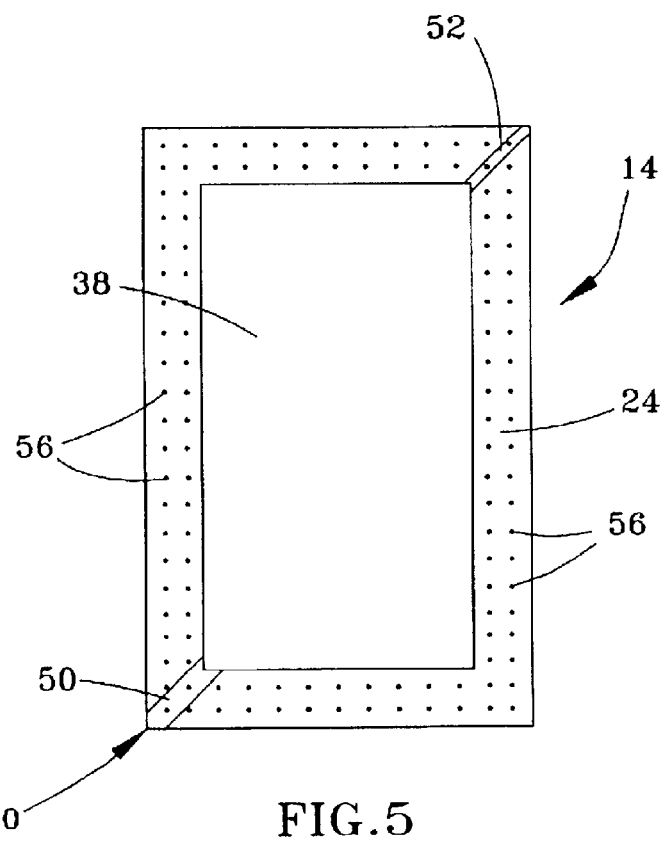
FIG. 5 is a plan view of one of the substrates of the package of FIGS. 3 and 4.

As is apparent from FIGS. 3, 4 and 5, the I/O PCB 14 is fabricated to have an interior opening 38, with the remainder of the PCB 14 defining a frame 40 that surrounds the opening 38. The opening 38 and frame 40 are illustrated as having rectangular shapes, though other shapes could be employed. As a result of the manner in which the PCB's 12 and 14 are assembled, the opening 38 in the I/O PCB 14 defines a cavity 42 in which are contained the flip chips 16 attached to the lower surface 20 of the carrier PCB 12. As also depicted in FIG. 3, the cavity 42 contains a compound 44 that encapsulate the flip chips 16 attached to the lower surface 20 of the carrier PCB 12. For this purpose, the package 10 is equipped with a gate 46 and vent 48 through which a suitable polymeric material can be injected into the cavity 42 to form the compound 44. The gate 46 and vent 48 are represented in FIGS. 3 through 5 as being formed by removing material from the surface 24 of the I/O PCB 14, preferably at two opposing corners of the PCB 14. In FIG. 5, the I/O PCB 14 is shown as having two slots 50 and 52 milled in its surface 24, the wider slot 50 corresponding to the gate 46 and the narrower slot 52 corresponding to the vent 48. The slots 50 and 52 extend diagonally from opposite corners of the opening 38 to the outer peripheral edge of the I/O PCB 14. When the I/O PCB 14 is assembled to the carrier PCB 12, the slots 50 and 52 are located between the PCB's 12 and 14, such that both the gate 46 and vent 48 are buried at opposite corners of the package 10.

Figure 6:
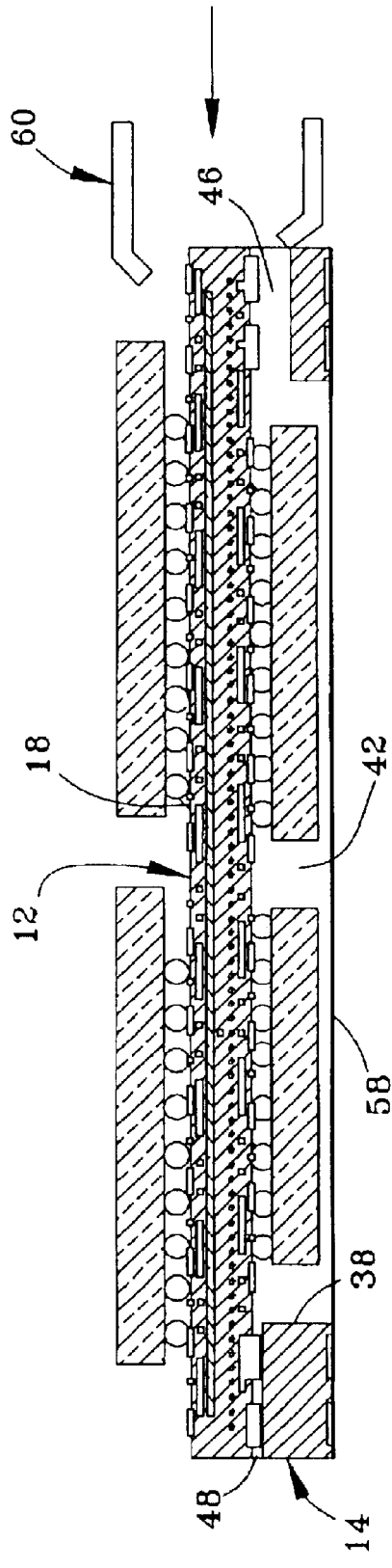
FIGS. 6 and 7 represent alternative configurations for gating and venting the package of FIG. 3 in accordance with the present invention.
Figure 7:
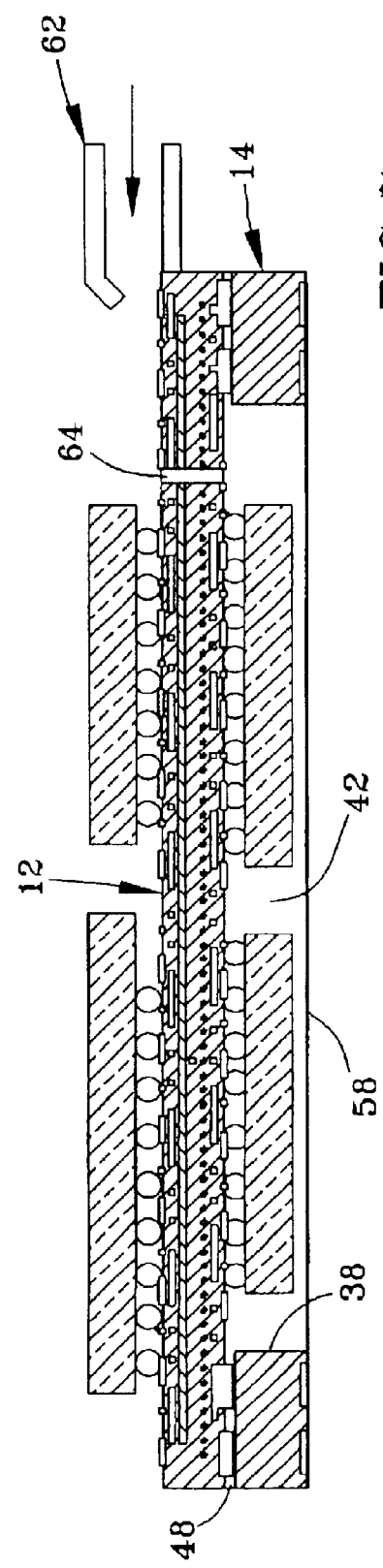

To fill the cavity 42 with the mold compound 44, a film-assisted molding (FAME) technique is preferably utilized. As represented in FIG. 6, a film 58 is applied to the lower surface 26 of the I/O PCB 14 prior to placement of the solder balls 28. A suitable liquid polymeric material, such as a thermoset epoxy, is then injected with a nozzle 60 through the gate 46 and into the cavity 42, and is thereafter cured to form the compound 44. As depicted in FIG. 6, the same polymeric material can be simultaneously injected with the nozzle 60 onto the upper surface 18 of the carrier PCB 12 to form a mold compound 54 that, as shown in FIG. 3, encapsulates and preferably underfills the chips 16 on the upper surface 18 of the PCB 12. As the cavity 42 fills with the polymeric material, the gaseous contents of the cavity 42, e.g., air, escape through the vent 48. Placement of the gate 46 and vent 48 at the package corners promotes the ability of the liquid polymeric material to completely fill the cavity 42 and reduces the occurrence of voids within the compound 44. An alternative approach is depicted in FIG. 7, in which the gate 46 is replaced with at least one internal gate 64, shown in the form of a through-hole in the PCB 12. In this embodiment, the polymeric material is injected with a nozzle 62 onto the upper surface 18 of the carrier PCB 12, and then flows downward into the cavity 42 through the internal gate 64. As before, the gaseous contents of the cavity 42 escape through the vent 48 as the cavity 42 fills with the polymeric material.

From the above description, it can be appreciated that a liquid material can be injected into the cavity 42 to both underfill and overmold the chips 16 on the lower surface 20 of the carrier PCB 12, and can be simultaneously deposited on the upper surface 18 of the PCB 12 to encapsulate and underfill chips 16 on the upper surface 18. The resulting package 10 thus has all of its chips 16 (as well as any other devices mounted to the carrier PCB 12), mechanically protected from extraneous damage as well as underfilled to promote the reliability of their solder connections 22. Also from the above description, it can be appreciated that the layouts of the PCB's 12 and 14 can be configured such that the package 10 can be molded in strip form, in which multiple packages 10 can be simultaneously molded in a single operation. In so doing, the manufacturing efficiency of the package 10 is increased while decreasing costs. The result is a cost-effective, high-density packaging technique by which various electrical components (flip chips 16, etc.) are mechanically protected within an electrically-testable package 10. These advantages are achieved while eliminating a separate underfill process, preferably utilizing instead a single molding operation during which chips 16 on both surfaces 18 and 20 of the carrier PCB 12 are simultaneously underfilled and overmolded.

While the invention has been described in terms of a preferred embodiment, it is apparent that other forms could be adopted by one skilled in the art. Accordingly, the scope of the invention is to be limited only by the following claims.

What is claimed is:

1. A package comprising:
   a first laminated substrate having a first conductor pattern on a first surface thereof and a second conductor pattern on an oppositely-disposed second surface thereof;
   a second laminated substrate attached to first laminate substrate, the second laminate substrate having an interior opening therethough and a frame portion surrounding the interior opening, the frame portion having a first surface facing the first laminate substrate and an oppositely-disposed second surface on which solder terminals are present;

first and second interal openings between the first and second laminate substrates and interconnecting the interior opening of the second laminate substrate with an outer perimeter of at least one of the first and second laminate substrates;

at least a first surface-mounted device on the first surface of the first laminate substrate and electrically connected to the first conductor pattern; and at least a second surface-mounted device on the second surface of the first laminate substrate and electrically connected to the second conductor pattern, the first and second laminate substrate being attached so that the second surface-mounted device is disposed within the interior opening of the second laminate substrate.

2. A package according to claim 1, wherein at least one of the first and second surface-mounted device is a flip chip having solder bump terminals on a surface thereof that physically and electrically correct the flip chip to the first laminate substrate.

3. A package according to claim 1, wherein the first and second surface-mounted device are flip chips having solder bump terminals on respective surfaces thereof, the solder bump terminals of the first surface-mounted device physically and electrically connecting the first surface-mounted device to the first conductor pattern on the first surface of the first laminate substrate, the solder bump terminals of the second surface-mounted device physically and electrically connecting the second surface-mounted device to the second conductor pattern on the second surface of the first laminate surface.

4. A package according to claim 1, wherein the second laminate substrate is electrically connected to the first laminate substrate, and the second laminate substrate has conductors that electrically connect the first and second conductor patterns on the first laminate substrate to the solder terminals on the second surface of the second laminate surface.

5. A package according to claim 1, wherein the first and second lateral openings are defined in diagonally-opposed first and second portions of the second laminate substrate.

6. A package according to claim 5, wherein the second laminate substrate and the interior opening have rectangular shapes, the first lateral opening is located at a first corner of the second laminate substrate, and the second lateral opening is located at a diagonally-opposed second corner of the second laminate substrate.

7. A package according to claim 5, wherein first and second lateral opening are defined by slots in the first of the second laminate substrate.

8. A package according to claim 1, further comprising a molding compound that fills the interior opening and the first and second lateral openings of the second laminate substrate and both underfills and encapsulates the second surface-mounted device.

9. A package according to claim 1, further comprising a molding compound on the first surface of the laminate substrate that encapsulates the first surface-mounted device.

10. A package according to claim 9, wherein the first laminate substrate has at least one opening therethrough that interconnects the molding compound on the first surface of the first laminate substrate with the molding compound within the interior opening of the second laminate substrate.

11. A multi-chip module comprising:

a first laminate circuit board having a first conductor pattern on a first surface thereof and a second conductor pattern on an oppositely-disposed second surface thereof;

a second laminate circuit board attached to first laminate circuit board, the second laminate circuit board having an interior opening therethrough and a frame portion surrounding the interior opening, the framing portion having a first surface facing the first laminate circuit board and an oppositely-disposed second surface on which solder terminals are present, the solder terminals of the second laminate circuit board being electrically interconnected with the first and second conductor patterns of the first laminate circuit board;

first and second slots in the first surface of the second laminate circuit board so as to define first and second lateral openings between the first and second laminate circuit boards, the first and second lateral openings interconnecting the interior opening of the second laminate circuit board with an outer perimeter of the second laminate circuit board;

at least a first flip-chip device on the first surface of the first laminate circuit board and electrically connected to the first conductor pattern with solder connections;

at least a second flip-chip device on the second surface of the first laminate circuit board and electrically connected to the second conductor pattern with solder connections, the first and second laminate circuit boards being attached so that the second flip-chip device is disposed within the interior opening of the second laminate circuit board; and a molding compound within the interior opening of the second laminate circuit board and both underfilling and encapsulating the second flip-chip device and the solder connections thereof.

12. A multi-chip module according to claim 11, wherein the solder terminals of the second laminate circuit board are electrically connected to the first laminate circuit board through metallized vias through the frame portion of the second laminate circuit board.

13. A multi-chip module according to claim 11, wherein the molding compound also fills the first and second lateral openings between the first and second laminate circuit boards.

14. A multi-chip module according to claim 11, wherein the second laminate circuit board and the interior opening therein have rectangular shapes, the first lateral opening interconnects a first corner of the interior opening and an adjacent first corner of the second laminate circuit board, and the second lateral opening interconnects a second corner of the interior opening and an adjacent second corner of the second laminate circuit board, the first corners of the interior opening and the second laminate circuit board being diagonally-opposite the second corners of the interior opening and the second laminate circuit board.

15. A multi-chip module according to claim 11, further comprising a molding compound that encapsulates the first-chip device.

* * * * *